(12) United States Patent
Luo et al.

(10) Patent No.: US 9,214,902 B2
(45) Date of Patent: Dec. 15, 2015

(54) BIAS-BOOSTING BIAS CIRCUIT FOR RADIO FREQUENCY POWER AMPLIFIER

(71) Applicant: TriQuint Semiconductor, Inc., Hillsboro, OR (US)

(72) Inventors: Sifen Luo, Potomac, MD (US); Kerry Burger, Summerfield, NC (US); George Nohra, Marlborough, MA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 63 days.

(21) Appl. No.: 14/011,315

(22) Filed: Aug. 27, 2013

(65) Prior Publication Data

US 2015/0061770 A1    Mar. 5, 2015

(51) Int. Cl.
*H03F 3/193* (2006.01)
*H03F 1/30* (2006.01)

(52) U.S. Cl.
CPC ............ *H03F 3/193* (2013.01); *H03F 1/301* (2013.01)

(58) Field of Classification Search
USPC .................. 330/285, 286, 288, 311
See application file for complete search history.

(56) References Cited

U.S. PATENT DOCUMENTS

| | | | |
|---|---|---|---|
| 6,392,492 B1 * | 5/2002 | Yuan | 330/311 |
| 6,486,739 B1 | 11/2002 | Luo | |
| 6,778,016 B2 * | 8/2004 | Luo | 330/288 |
| 7,332,968 B2 | 2/2008 | Luo | |
| 7,365,604 B2 | 4/2008 | Luo | |
| 7,994,861 B2 * | 8/2011 | Fisher et al. | 330/288 |
| 8,803,612 B1 * | 8/2014 | Ooi et al. | 330/296 |

* cited by examiner

*Primary Examiner* — Hieu Nguyen
(74) *Attorney, Agent, or Firm* — Withrow & Terranova, P.L.L.C.

(57) ABSTRACT

Various embodiments provide a bias circuit for a radio frequency (RF) power amplifier (PA) to provide a direct current (DC) bias voltage, with bias boosting, to the RF PA. The bias circuit may include a bias transistor that forms a current mirror with an amplifier transistor of the RF PA. The bias circuit may further include a first resistor coupled between the gate terminal and the drain terminal of the bias transistor to block RF signals from the gate terminal of the bias transistor. The bias circuit may further include a second resistor coupled between the drain terminal of the bias transistor and the RF PA (e.g., the gate terminal of the amplifier transistor). An amount of bias boosting of the DC bias voltage provided by the bias circuit may be based on an impedance value of the second resistor.

19 Claims, 4 Drawing Sheets

BIAS-BOOSTING BIAS CIRCUIT FOR RADIO FREQUENCY POWER AMPLIFIER

FIELD

Embodiments of the present disclosure relate generally to the field of circuits, and more particularly to bias-boosting bias circuits for radio frequency power amplifiers.

BACKGROUND

In many wireless communication systems, the peak-to-average ratio (PAR) of transmitted signals is high. For example, in wireless local area networks (WLANs) employing orthogonal frequency division multiplexing (OFDM) modulation, the PAR of the communicated signals may be as high as 13.5 decibels. To handle high PAR signals, radio frequency (RF) power amplifiers typically include large transistors. The RF power amplifier usually includes a bias circuit to bias the transistors of the amplifier. However, the bias circuit can cause gain compression at high signal power levels.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
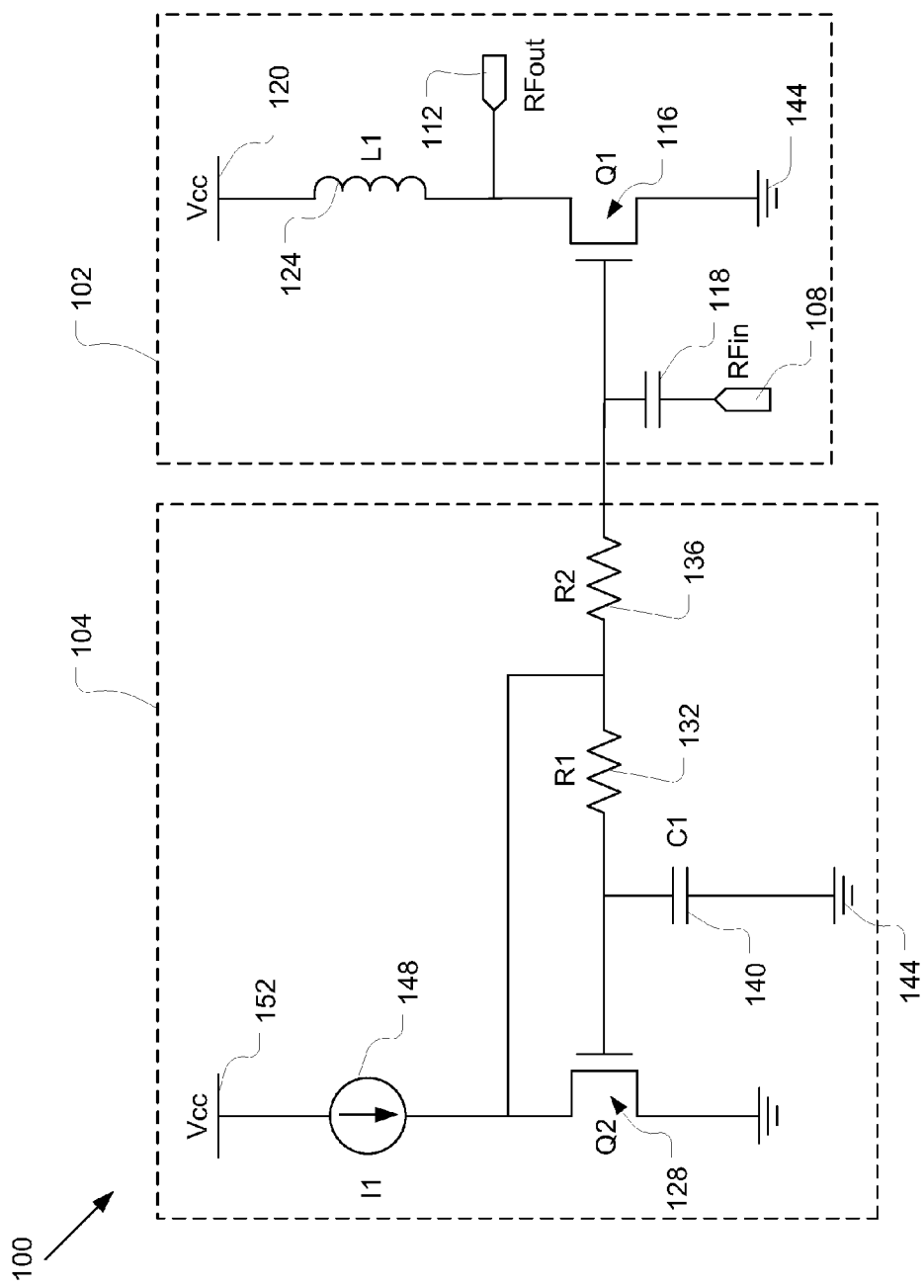
FIG. 1 illustrates a circuit diagram of a radio frequency (RF) power amplifier (PA) module including an RF PA and a bias circuit in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various embodiments may provide a radio frequency (RF) power amplifier (PA) circuit including an RF PA and a bias circuit. The bias circuit may provide a direct current (DC) bias voltage to the RF PA. The bias circuit may include a bias transistor having a gate terminal, a drain terminal, and a source terminal, and the RF PA may include an amplifier transistor. In various embodiments, the bias transistor may form a current mirror with the amplifier transistor. The bias circuit may further include a first resistor coupled between the gate terminal and the drain terminal of the bias transistor to block RF signals from the gate terminal of the bias transistor.

In various embodiments, the bias circuit may provide bias boosting for the DC bias voltage. That is, the bias circuit may increase the DC bias voltage as an RF power (e.g., average power) of an RF input signal amplified by the RF amplifier increases. The bias circuit may further include a second resistor coupled between the drain terminal of the bias transistor and the RF PA (e.g., the gate terminal of the amplifier transistor). An amount of bias boosting of the DC bias voltage provided by the bias circuit may be based on an impedance value of the second resistor. In some embodiments, the bias circuit may further include a capacitor coupled between the gate terminal of the bias transistor and a ground potential to provide a discharge path for RF signals (e.g., from the gate terminal to the ground potential).

FIG. 1 illustrates an RF PA circuit 100 in accordance with various embodiments. The RF PA circuit 100 may include an RF PA 102 and a bias circuit 104 coupled with the RF PA 102. The RF PA 102 may receive an RF input signal RFin at an input terminal 108 and produce an amplified RF output signal RFout at an output terminal 112. The RF PA 102 may be used, for example, to amplify RFin for transmission over a wireless communications network.

In various embodiments, the RF PA 102 may include an amplifier transistor 116 (e.g., Q1). In some embodiments, the RF PA 102 may be a complementary metal-oxide-semiconductor (CMOS) amplifier. For example, in some embodiments, the amplifier transistor 116 may be an n-type field-effect transistor (FET). In other embodiments, the RF PA 102 may be another type of amplifier, and/or the amplifier transistor 116 may be another type of transistor.

The amplifier transistor 116 may include a gate terminal, a source terminal, and a drain terminal. The gate terminal of the amplifier transistor 116 may be coupled with the input terminal 108 of RF PA 102 (e.g., via a capacitor 118) to receive the RF input signal. The drain terminal of the amplifier transistor 116 may be coupled with the output terminal 112 to provide the RF output signal. The drain terminal of the amplifier transistor 116 may be further coupled with a power supply rail 120 to provide a DC supply voltage (Vcc). An inductor 124 (e.g., L1) may be coupled between the power supply rail 120 and the output terminal 112 and/or the drain terminal of the amplifier transistor 116 to block RF signals from reaching the power supply rail 120. In some embodiments, the source terminal of the amplifier transistor 116 may be coupled with a ground potential 144.

In some embodiments, the RF PA 102 may include other transistors, in addition to the amplifier transistor 116, coupled between the input terminal 108 and the output terminal 112. For example, the RF PA 102 may be a stacked amplifier, with another transistor (not shown) coupled in series with the amplifier transistor 116 and between the amplifier transistor 116 and the output terminal 112 (e.g., with the source terminal of the other transistor coupled with the drain terminal of the amplifier transistor 116). Alternatively, or additionally, the RF PA 102 may have a plurality of amplifier stages, and the amplifier transistor 116 may be included in one of the plurality of amplifier stages.

In some embodiments, the RF PA circuit 100 may further include an input matching network (not shown) coupled to the input terminal 108 and/or output terminal 112 for impedance matching with other components (e.g., of a wireless communication device).

In various embodiments, the bias circuit 104 may be coupled with the gate terminal of the amplifier transistor 116 to provide a DC bias voltage to the amplifier transistor 116 and/or RF PA 102. For example, the DC bias voltage may bias the RF PA 102 and/or amplifier transistor 116 in an amplifying mode. In some embodiments, the DC bias voltage may bias the RF PA 102 in a class AB amplifier operating mode.

The bias circuit 104 may include a bias transistor 128 (e.g., Q2) with a gate terminal, a drain terminal, and a source terminal. In some embodiments, the bias transistor 128 may be an n-type FET. The bias transistor 128 may be coupled with the amplifier transistor 116 to form a current mirror between the bias transistor 128 and the amplifier transistor 116. In some embodiments, the current mirror may be a simple current mirror. For example, the gate terminal of the bias transistor 128 may be coupled with the gate terminal of the amplifier transistor 116. A current source 148 (e.g., I1) may be coupled with the drain terminal of the bias transistor 128 to provide a current to the current mirror. In some embodiments, the bias transistor 128 may be smaller than the amplifier transistor 116. For example, in one non-limiting embodiment, the ratio of size of the amplifier transistor 116 to the bias transistor 128 may be about 16 to 1.

In various embodiments, the bias circuit 104 may further include a first resistor 132 (e.g., R1) coupled between the gate terminal and the drain terminal of the bias transistor 128. The first resistor 132 may block RF signals from the gate terminal of the bias transistor 128. For example, the first resistor 132 may prevent RF signals from passing from the drain terminal of the bias transistor 128 to the gate terminal.

In some embodiments, the bias circuit 104 may further include a capacitor 140 (e.g., C1) coupled between the gate terminal of the bias transistor 128 and the ground potential 144 to provide a discharge path for RF signals (e.g., from the gate terminal of the bias transistor 128 to the ground potential 144). The capacitor 140 may provide further filtering and/or isolation from RF signals for the gate terminal of the bias transistor 128, in addition to the isolation provided by the first resistor 132.

The blocking of RF signals from the gate terminal of the bias transistor 128 may facilitate bias boosting of the DC bias voltage by the bias circuit 104 at higher RF power levels of the RF input signal, without introducing significant gain compression. Accordingly, the bias circuit 104 may provide an extended output power at 1 decibel compression (P1 dB) for the RF PA 102 compared with prior bias circuit designs.

The bias circuit 104 may further include a second resistor 136 (e.g., R2) coupled between the gate terminal of the bias transistor 128 and the RF PA 102 (e.g., the amplifier transistor 116 of the RF PA 102). An amount of bias boosting of the DC bias voltage provided by the bias circuit 104 may be based on an impedance value of the second resistor 136. For example, the amount of bias boosting of the DC bias voltage provided by the bias circuit 104 may be based on the relative value of the second resistor 136 compared with an impedance value of the current source 148. A lower relative impedance value for the second resistor 136 compared with the impedance value of the current source 148 may cause the bias circuit 104 to provide more bias boosting compared with an embodiment in which the second resistor 136 has a higher relative impedance value. Accordingly, the amount of bias boosting provided by the bias circuit 104 may be selected according to the needs of the RF PA 102 and/or the type of wireless communication to be performed by the RF PA 102. For example, higher bias boosting may be used for an RF PA 102 that is to be used for wireless communication using orthogonal frequency division multiplexing (OFDM) than for some other types of communication.

In various embodiments, the current source 148 may be coupled with a supply rail 152 to provide electrical power to the current source 148 and/or bias circuit 104. In some embodiments, the current source 148 may include a voltage source (not shown) coupled with a resistor (not shown) to provide a current. In some embodiments, the supply rail 152 may be coupled with, and/or at the same voltage as, the supply rail 120.

As discussed above, the bias transistor 128 and amplifier transistor 116 may form a current mirror to bias the RF PA 102. In some embodiments, the current mirror may be a simple current mirror, as shown in FIG. 1. In various embodiments, the second resistor 136 may have an impedance value that is significantly less than an impedance value of the first resistor 132 and/or an impedance value of the current source 148. For example, the impedance value of the second resistor may be 1/100 or less, such as 1/1000 or less, of the impedance value of the first resistor 132 and/or the impedance value of the current source 148. In one non-limiting embodiment, the impedance value of the first resistor 132 may be about 10 kOhms, the impedance value of the second resistor 136 may be about 10 Ohms, and the impedance value of the current source may be about 2.63 kOhms. As discussed above, the amount of bias boosting provided by the bias circuit 104 may be based on the impedance value of the second resistor 136 (e.g., relative to the impedance value of the current source 148 and/or first resistor 132). Accordingly, the impedance value of the second resistor 136 may be adjusted to provide the desired amount of bias boosting for the DC bias voltage.

With the relatively small impedance value of the second resistor 136, when an RF signal arrives at the gate terminal of the amplifier transistor 116 (e.g., via the input terminal 108), a large portion of the RF signal is also seen at the drain terminal of the bias transistor 128. At certain RF power levels of the RF signal, the RF signal may go below zero volts during the negative half cycle of the RF signal swing. During the positive half cycle of the RF signal the bias transistor 128 may be on and the drain terminal of the bias transistor 128 may be charged, with a charging time constant, through the second resistor 136. The drain terminal of the bias transistor 128 may also be charged through a parasitic capacitor Cds (not shown) coupled between the drain terminal and source terminal of the bias transistor 128. The capacitance value of Cds may be significantly smaller than the capacitance value of the capacitor 140. When the RF signal swings below zero volts during the negative half cycle of the RF signal, the bias transistor 128 may be off and the drain terminal of the bias transistor 128 may be discharged, with a discharging time constant, through the first resistor 132 and the capacitor 140.

The impedance value of the first resistor 132 and the capacitance value of the capacitor 140 may be selected so that the discharging time constant is larger than the charging time constant. For example, in one non-limiting embodiment the impedance value of the first resistor 132 may be about 10 kOhms and the capacitance value of the capacitor 140 may be about 10 picoFarads. Therefore, as the RF power level of the RF signal increases, charge may accumulate at the drain terminal of the bias transistor 128. This charge accumulation results in an increase of DC voltage at the drain terminal of the bias transistor 128. The DC voltage increase at the drain terminal of the bias transistor 128, in turn, leads to an increase in the DC bias voltage at the gate terminal of the amplifier transistor 116 since the gate terminal of the amplifier transistor 116 and the drain terminal of the bias transistor 128 are coupled with one another through the second resistor 136 and there is no DC current passing through the second resistor 136. Accordingly, the bias circuit 104 boosts the DC bias voltage at the gate terminal of the amplifier transistor 116, with the DC bias voltage increasing as the RF power level of the RF input signal increases. The bias boosting may extend the P1 dB of the RF PA 102, to allow the RF PA 102 to operate at high RF power levels.

As discussed above, the RF PA 102 may be a CMOS power amplifier. The bias circuit 104 may be especially suitable for biasing CMOS PAs. This is because there is no DC path between the gate terminals of the CMOS transistors 116 and 128 in FIG. 1. Accordingly, the ratio of the first resistor 132 to the second resistor 136 does not have to be the same as the ratio of the amplifying transistor 116 to the bias transistor 128. In contrast, for a bipolar junction transistor (BJT) design, the ratio of R1 to R2 must be the same as the ratio of Q1 to Q2. Otherwise, the circuit will not form a current mirror circuit. Additionally, the circuit 100 may require fewer transistors in the bias circuit (e.g., bias transistor 128) than prior designs. This may make the circuit 100 more economical than BJT designs.

In other embodiments, the circuit 100 may be used with BJT transistors for the amplifying transistor 116 and/or bias transistor 128. In some embodiments, a large-value inductor may be included between the base of the bias transistor 128 and the first resistor 132 to prevent RF signals from reaching the base of the bias transistor 128 so that the ratio of R1 to R2 can be same as that of Q1 to Q2.

Figure 2:
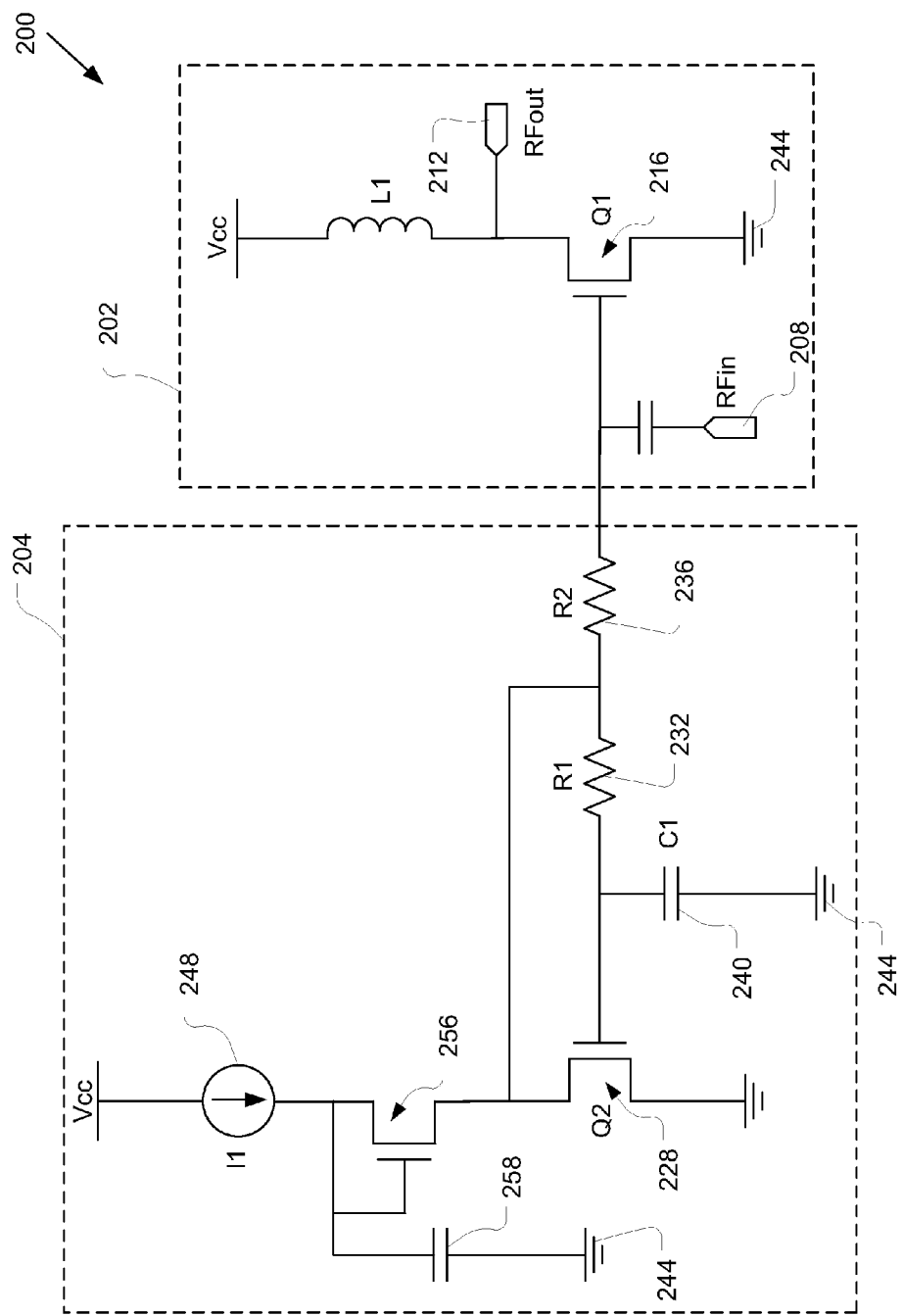
FIG. 2 illustrates an alternative configuration of an RF PA module in accordance with various embodiments.

FIG. 2 illustrates an alternative embodiment of an RF PA circuit 200, in which a bias circuit 204 includes a diode-connected transistor 256 coupled between a drain terminal of a bias transistor 228 and a current source 248, in accordance with various embodiments. RF PA circuit 200 may include an RF PA 202 having an amplifier transistor 216. The RF PA 202 may receive an RF input signal at an input terminal 208 and produce an RF output signal at an output terminal 212. The RF PA circuit 200 may further include a bias circuit 204 having a bias transistor 228. The bias circuit 204 may further include a first resistor 232, a second resistor 236, and a capacitor 240 arranged in a similar configuration to the first resistor 132, second resistor 136, and capacitor 140, respectively, shown in FIG. 1 and discussed above.

In various embodiments, the bias circuit 204 may further include a diode-connected transistor 256 coupled between the drain terminal of the bias transistor 228 and the current source 248. A decoupling capacitor 258 may be coupled between the drain terminal (and gate terminal) of the diode-connected transistor 252 and a ground potential 244. The diode-connected transistor 256 may turn off when the power of the RF input signal becomes higher than a threshold. This may provide additional bias boosting to the gate terminal of the amplifier transistor 216.

Figure 3:
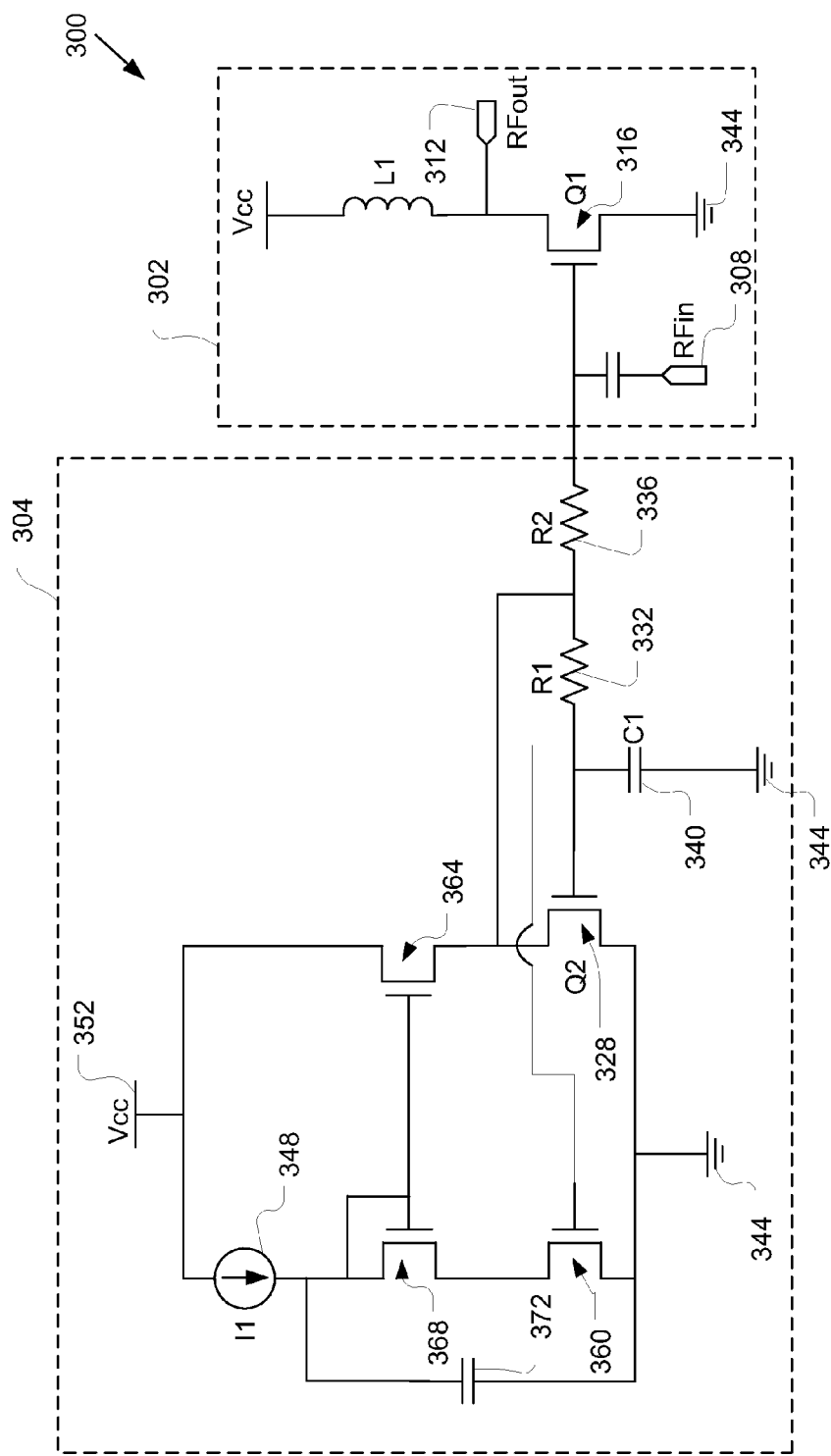
FIG. 3 illustrates another alternative configuration of an RF PA module in accordance with various embodiments.

FIG. 3 illustrates another alternative embodiment of an RF PA circuit 300 having a bias circuit 304 that includes a Wilson current mirror with a bias transistor 328 in accordance with various embodiments. RF PA circuit 300 may further include an RF PA 302 coupled with the bias circuit 304. The RF PA 302 may include an amplifier transistor 316, and may receive an RF input signal at an input terminal 308 and produce an RF output signal at an output terminal 312. The bias circuit 304 may further include a first resistor 332, a second resistor 336, and a capacitor 340 arranged in a similar configuration to the first resistor 132, second resistor 136, and capacitor 140, respectively, shown in FIG. 1 and discussed above.

In various embodiments, the Wilson current mirror may include transistor 360, transistor 364, and transistor 368 along with bias transistor 328. The current source 348 may be coupled between a drain terminal of transistor 368 and a supply rail 352. A capacitor 372 may be coupled between the drain terminal of transistor 368 and a ground potential 344. The Wilson current mirror of bias circuit 304 may reduce the required value of the current source 348 compared with the value of current source 148 of bias circuit 104.

Figure 4:
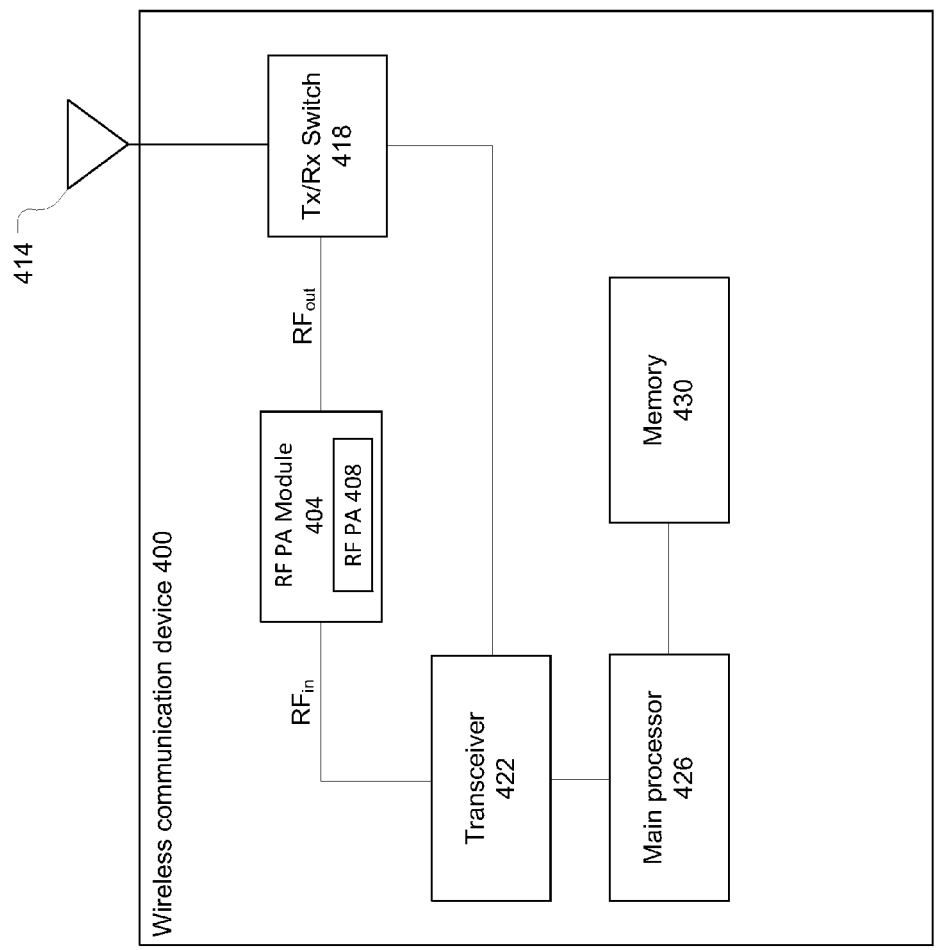
FIG. 4 is a block diagram of an exemplary wireless communication device in accordance with various embodiments.

A block diagram of an exemplary wireless communication device 400 is illustrated in FIG. 4 in accordance with some embodiments. Wireless communication device 400 may have a RF PA module 404 including one or more RF PA circuits 408, which may be similar to RF PA circuit 100, 200, and/or 300. In addition to the RF PA module 404, the wireless communication device 400 may have an antenna structure 414, a Tx/Rx switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to the RF PA module 404. The transceiver 422 may also control the RF PA module 404 to operate in selected bands and in either full-power or backoff-power modes. In some embodiments, the transceiver 422 may generate the $RF_{in}$ signal(s) using OFDM modulation.

The RF PA module 404 may amplify the $RF_{in}$ signal(s) to provide $RF_{out}$ signal(s) as described herein. The $RF_{out}$ signal(s) may be forwarded to the Tx/Rx switch 418 and then to the antenna structure 414 for an over-the-air (OTA) transmission. In some embodiments, Tx/Rx switch 418 may include a duplexer.

In a similar manner, the transceiver 422 may receive an incoming OTA signal from the antenna structure 414 through the Tx/Rx switch 418. The transceiver 422 may process and send the incoming signal to the main processor 426 for further processing.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   a radio frequency (RF) power amplifier to amplify an RF input signal, the RF power amplifier having an amplifier transistor with a gate terminal configured to receive the RF input signal;
   a bias circuit coupled with the gate terminal of the amplifier transistor, the bias circuit to provide a direct current (DC) bias voltage at the gate terminal of the amplifier transistor wherein the bias circuit includes:
      a bias transistor having a gate terminal, a drain terminal, and a source terminal, the gate terminal of the bias transistor coupled with the gate terminal of the amplifier transistor to form a current mirror;
      a first resistor coupled between the gate terminal and the drain terminal of the bias transistor to block RF signals from the gate terminal of the bias transistor; and
      a second resistor coupled between the drain terminal of the bias transistor and the gate terminal of the amplifier transistor, wherein an amount of bias boosting of a direct current (DC) bias voltage provided by the bias circuit is based on an impedance value of the second resistor,
      wherein the bias circuit further includes a Wilson current mirror that includes the bias transistor.

2. The circuit of claim 1, further comprising a capacitor coupled between the gate terminal of the bias transistor and a ground potential to provide a discharge path for RF signals.

3. The circuit of claim 1, further comprising a current source coupled with the drain terminal of the bias transistor.

4. The circuit of claim 3, wherein the impedance value of the second resistor is $1/100$ or less of an impedance value of the current source.

5. The circuit of claim 1, wherein the RF power amplifier is a complementary metal-oxide-semiconductor (CMOS) amplifier.

6. The circuit of claim 1, wherein the bias transistor is to increase the DC bias voltage as an RF power of the RF input signal amplified by the RF amplifier increases.

7. A system comprising:
   a radio frequency (RF) power amplifier to amplify an RF input signal, the RF power amplifier having a first amplifier transistor with a gate terminal to receive the RF input signal, wherein the RF power amplifier is a complementary metal-oxide-semiconductor (CMOS) amplifier, and wherein the RF power amplifier is a stacked power amplifier further including a second amplifier transistor having a source terminal coupled with a drain terminal of the first amplifier transistor;
   a bias circuit coupled with the gate terminal of the first amplifier transistor, the bias circuit to provide a direct current (DC) bias voltage at the gate terminal of the first amplifier transistor, wherein the bias circuit includes:
      a bias transistor having a gate terminal, a drain terminal, and a source terminal, the gate terminal of the bias transistor coupled with the gate terminal of the first amplifier transistor to form a current mirror;
      a first resistor coupled between the gate terminal and the drain terminal of the bias transistor to block RF signals from the gate terminal of the bias transistor;
      a capacitor coupled between the gate terminal of the bias transistor and a ground potential to provide a discharge path for RF signals; and
      a second resistor coupled between the drain terminal of the bias transistor and the gate terminal of the first amplifier transistor;
      wherein the bias circuit is configured to increase the DC bias voltage as an RF power of an RF input signal amplified by the RF amplifier increases, wherein an amount of the increase of the DC bias voltage is based on an impedance value of the second resistor.

8. The system of claim 7, wherein the bias circuit further includes a current source coupled with the drain terminal of the bias transistor.

9. The system of claim 8, wherein the impedance value of the second resistor is $1/100$ or less than an impedance value of the current source.

10. The system of claim 7, wherein the bias circuit further includes a diode-connected transistor coupled with the drain of the bias transistor to provide additional bias boosting.

11. The system of claim 7, wherein the bias circuit further includes a Wilson current mirror that includes the bias transistor.

12. The system of claim 7, further comprising a transmitter coupled with the RF power amplifier to provide the RF input signal to the RF power amplifier.

13. A system comprising:
   a radio frequency (RF) power amplifier to amplify an RF input signal, the RF power amplifier having an amplifier transistor with a gate terminal to receive the RF input signal;
   a bias circuit coupled with the gate terminal of the amplifier transistor, the bias circuit to provide a direct current (DC) bias voltage at the gate terminal of the amplifier transistor, wherein the bias circuit includes:
      a bias transistor having a gate terminal, a drain terminal, and a source terminal, the gate terminal of the bias transistor coupled with the gate terminal of the amplifier transistor to form a current mirror;

a first resistor coupled between the gate terminal and the drain terminal of the bias transistor to block RF signals from the gate terminal of the bias transistor;

a capacitor coupled between the gate terminal of the bias transistor and a ground potential to provide a discharge path for RF signals;

a second resistor coupled between the drain terminal of the bias transistor and the gate terminal of the amplifier transistor; and a diode-connected transistor coupled with the drain of the bias transistor to provide additional bias boosting;

wherein the bias circuit is configured to increase the DC bias voltage as an RF power of an RF input signal amplified by the RF amplifier increases, wherein an amount of the increase of the DC bias voltage is based on an impedance value of the second resistor.

14. The system of claim 13, wherein the bias circuit further includes a current source coupled with the drain terminal of the bias transistor.

15. The system of claim 14, wherein the impedance value of the second resistor is $1/100$ or less than an impedance value of the current source.

16. A system comprising:

a radio frequency (RF) power amplifier to amplify an RF input signal, the RF power amplifier having an amplifier transistor with a gate terminal to receive the RF input signal;

a bias circuit coupled with the gate terminal of the amplifier transistor, the bias circuit to provide a direct current (DC) bias voltage at the gate terminal of the amplifier transistor, wherein the bias circuit includes:

a bias transistor having a gate terminal, a drain terminal, and a source terminal, the gate terminal of the bias transistor coupled with the gate terminal of the amplifier transistor to form a current mirror;

a first resistor coupled between the gate terminal and the drain terminal of the bias transistor to block RF signals from the gate terminal of the bias transistor;

a capacitor coupled between the gate terminal of the bias transistor and a ground potential to provide a discharge path for RF signals; and a second resistor coupled between the drain terminal of the bias transistor and the gate terminal of the amplifier transistor;

wherein the bias circuit is configured to increase the DC bias voltage as an RF power of an RF input signal amplified by the RF amplifier increases, wherein an amount of the increase of the DC bias voltage is based on an impedance value of the second resistor; and wherein the bias circuit further includes a Wilson current mirror that includes the bias transistor.

17. The system of claim 16, wherein the bias circuit further includes a current source coupled with the drain terminal of the bias transistor.

18. The system of claim 17, wherein the impedance value of the second resistor is $1/100$ or less than an impedance value of the current source.

19. The system of claim 16, wherein the RF power amplifier is a complementary metal-oxide-semiconductor (CMOS) amplifier.

* * * * *